United States Patent [19]

Patel et al.

[11] Patent Number: 4,808,948

[45] Date of Patent: Feb. 28, 1989

[54] AUTOMATIC TUNING SYSTEM FOR ULTRASONIC GENERATORS

[75] Inventors: Dipakkumar I. Patel, Elkins Park; Randall S. Giampa, Horsham, both of Pa.

[73] Assignee: Kulicke and Soffa Indusries, Inc., Willow Grove, Pa.

[21] Appl. No.: 101,839

[22] Filed: Sep. 28, 1987

[51] Int. Cl.$^4$ ............................................... H03L 7/00
[52] U.S. Cl. ........................................ 331/4; 156/73.2; 228/4.5; 228/110; 331/154; 366/116
[58] Field of Search ...................... 331/1 A, 4, 25, 154, 331/156; 228/4.5, 110, 111; 156/73.1, 73.2, 73.3, 73.4, 580.1; 310/316, 317, 318, 314; 366/116; 318/116; 367/137, 138

[56] References Cited

U.S. PATENT DOCUMENTS

| | | | |
|---|---|---|---|
| 3,826,993 | 7/1974 | White | 331/154 X |
| 4,056,761 | 11/1977 | Jacoby et al. | 318/116 |
| 4,168,916 | 9/1979 | Yamada et al. | 366/116 |
| 4,275,363 | 6/1981 | Mishiro et al. | 331/4 |
| 4,558,596 | 12/1985 | McBrearty et al. | 73/588 |

Primary Examiner—Siegfried H. Grimm
Attorney, Agent, or Firm—John B. Sowell

[57] ABSTRACT

Apparatus for periodically sweeping a voltage controlled oscillator over a range of frequencies which includes a resonant frequency of a transducer being supplied with power by the voltage controlled oscillator through a power amplifier. The apparatus includes a digital phase detector having a voltage input coupled to the output of the power amplifier and a second voltage input coupled to a current sensor indicative of the phase of the current flowing through the supply circuit of the transducer to provie at the output of the phase detector a voltage signal indicative of phase difference between the voltage and the current in the transducer. The output of the phase detector is coupled to a processor and to the input of a summing circuit. The output of the processor is also coupled to the summing circuit to provide an offset voltage which adjusts the voltage controlled oscillator to the resonant frequency of the transducer.

9 Claims, 2 Drawing Sheets

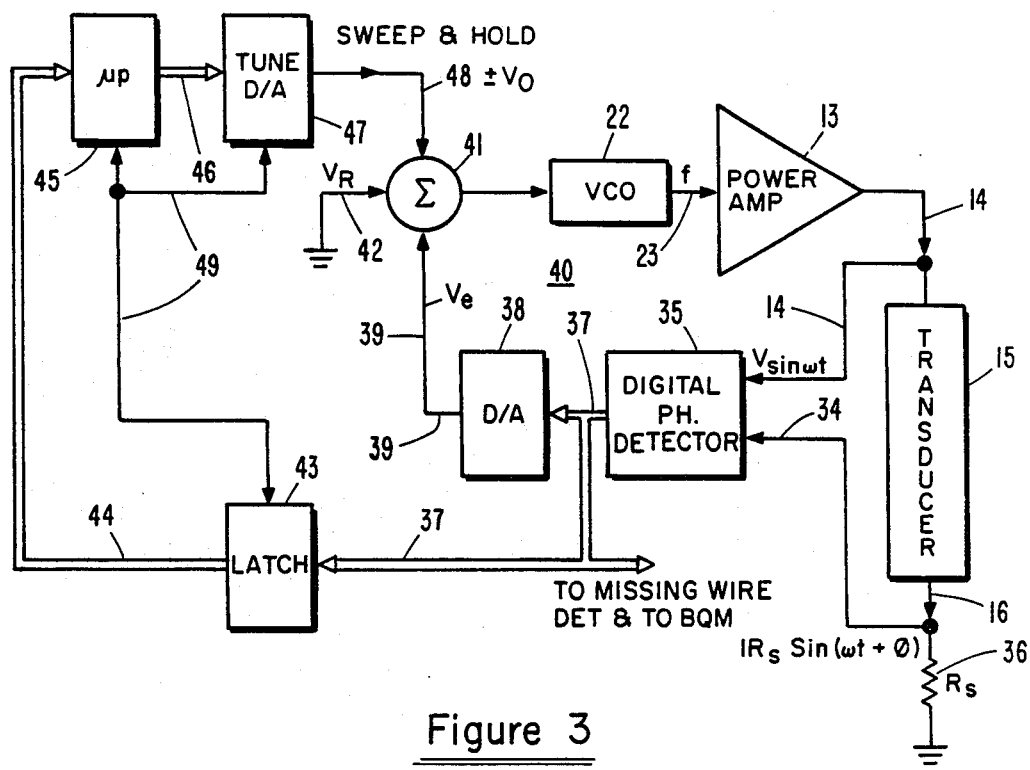
Figure 3
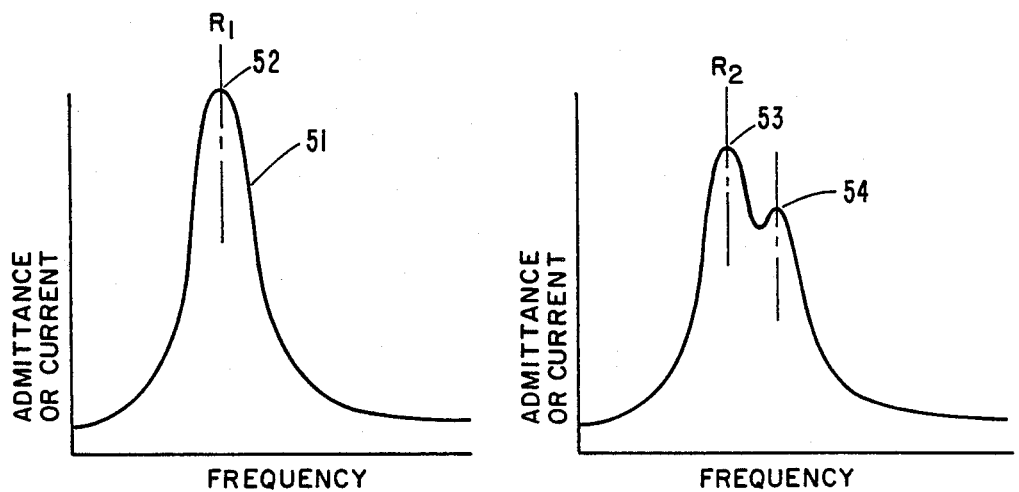
Figure 4
Figure 5

AUTOMATIC TUNING SYSTEM FOR ULTRASONIC GENERATORS

BACKGROUND OF THE INVENTION

1. Field of the Invention

The present invention relates to power supply generators of the type employed to drive ultrasonic transducers that are used in wire and die bonders. More particularly, the present invention relates to a system and a circuit for automatically tuning an ultrasonic generator to the resonant frequency of a particular ultrasonic transducer which contains a bonding tool and changes its resonant frequency under load.

2. Description of the Prior Art

Heretofore, manufacturers of ultrasonic power supply equipment have employed phase lock loop circuits (PLL) to enable ultrasonic power supply generators to track the resonant frequency of a transducer. Presumably, the phase lock loop circuit has a frequency range which accommodates the variations in resonant frequency which occur when the transducer is loaded under various conditions or different transducers and bonding tools are interchanged with the power supply which is an integral part of a bonder.

In prior art power supply generator systems, it was necessary to employ manual sweeping of the frequency of the transducer to find a resonant frequency for the transducer and generator. Even when the generator is tuned to the resonant frequency of the transducer during initial set-up, changes occur which change the resonant frequency of the transducer during actual operation. It is common practice to build a wire bonder or die bonder and to set up the resonant frequency of the transducer and generator without applying actual load conditions which effect the resonant frequency of the transducer. It is known that the changes in the resonant frequency of the transducer also affect the phase of the phase lock loop which cause the phase between current and voltage to change in a direction which is other than zero.

Heretofore, it was necessary to manually set-up the wire or die bonder power supply generator and to allow the bonding machine to warm up and stabilize. Then the transducer could be loaded under actual or simulated conditions to permit manual setting of the frequency of the generator to the resonant frequency of the transducer under load, however, the resonant frequency of the transducer changes under actual manufacturing conditions. In these prior art systems, it was also necessary to use special instrumentation and make time consuming manual set-up adjustments every time there was a tool or device type change on a bonding machine which occurs as often as every shift. Many manufacturers employing automatic wire and die bonders would not take the necessary time to make the proper adjustments and the quality of the semiconductor devices being manufactured has suffered as a result.

Prior art power supply generator systems may be characterized as set it and forget it. Prior art power supply generator systems depended on having a highly accurate transducer whose resonant frequency was known and made to a tight specification. Prior art transducer and power supply systems did not incorporate means for transmitting optimum power to the transducer system. Prior art power supply generator systems were made to such a tight specification that it was possible for the phase lock loop to be incapable of tracking the resonant frequency of the transducer. Prior art power supply generators did not monitor the condition of the ultrasonic system and as a result of this and the other aforementioned problems did not produce consistent bond quality. When the power supply generator system properly monitors the ultrasonic system, the information available may be employed to monitor both bond quality and to determine missing wires.

It would be desirable to eliminate the time consuming manual set-up and preparation necessary to prepare a wire or die bonder for production operations. Further, it would be desirable to provide a system which automatically tunes the ultrasonic power supply generator to the resonant frequency of the loaded transducer under actual bonding conditions in a few seconds and continues to track and lock onto the resonant frequency of the loaded transducer under operating conditions.

SUMMARY OF THE INVENTION

It is a principal object of the present invention to provide an automatic tuning system for ultrasonic power supply generators of the type employed in wire and die bonders.

It is another principal object of the present invention to provide an automatic tuning system for ultrasonic power supply generators that is self-calibrating.

It is another object of the present invention to provide an automatic tuning system which monitors the condition of the ultrasonic system.

It is another object of the present invention to provide an automatic tuning system that maintains optimum power output of the ultrasonic power supply generator to the transducer.

It is another object of the present invention to provide an automatic tuning system for ultrasonic power supply generators that is so flexible that specifications for the transducers used with the system may be lowered, thus, reducing production costs.

It is yet another object of the present invention to provide an automatic tuning system that maintains optimum quality of bonds by maintaining optimum power output.

It is yet another object of the present invention to provide an automatic tuning system that may be monitored by and/or controlled by a factory automation system.

It is yet another object of the present invention to provide an automatic tuning system that generates digital information which may be employed to detect missing wires and bond quality.

According to these and other objects of the present invention, there is provided a digital phase detector coupled to the input and output voltage of an ultrasonic transducer to determine the phase difference between the voltage and the current at the transducer. The phase difference between the voltage and the current is converted to a digital phase error output which is fed back to a phase lock loop and to a VCO to maintain resonant frequency of the transducer. The phase difference between the voltage and the current is also fed to a host computer which superimposes a sweep voltage on the VCO and monitors the phase difference between the current and the voltage to determine an offset voltage which is required to maintain the phase difference between the voltage and the current at the transducer at a zero phase which is indicative of a resonant condition of the transducer.

BRIEF DESCRIPTION OF THE DRAWINGS

FIG. 3 is a schematic block diagram of the present invention automatic tuning system for ultrasonic power supply generators;

FIG. 4 is a waveform plot of the admittance of a transducer versus its frequency relationship; and FIG. 5 is another waveform lot showing a defective transducer and its admittance versus frequency relationship.

DESCRIPTION OF THE PREFERRED EMBODIMENT

Figure 1:
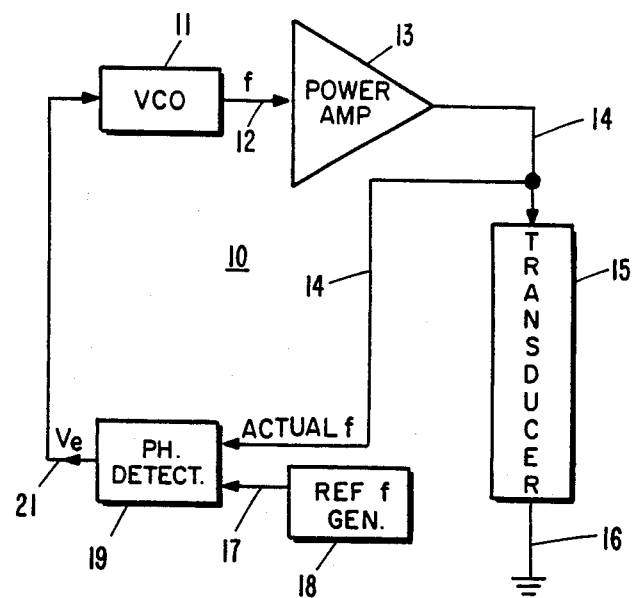
FIG. 1 is a schematic block diagram of a prior art phase lock loop (PLL)

Refer now to FIG. 1 showing a prior art phase lock loop of the type which has been employed to maintain the frequency of an ultrasonic power supply generator. Phase lock loop 10 comprises a voltage controlled oscillator 11 whose frequency output on line 12 is applied to a power amplifier 13. The output of amplifier 13 on line 14 is applied to the power element of the transducer 15 which may comprise a magneto-restrictive element or a piezoelectric element which is grounded at line 16. The actual frequency on line 14 is compared with a reference frequency on line 17 generated by reference frequency generator 18. Technically, the comparison of the voltage waves from the two inputs is a comparison of the phase of the sinusoidal waves and the phase detector 19 generates an error voltage output on line 21 proportional to the phase difference of the two inputs on lines 14 and 17. The error voltage on line 21 is applied to the voltage controlled oscillator so as to adjust its frequency until the frequency of VCO 11 is equal to the frequency of the reference generator 18. Phase lock loops of the type shown in FIG. 1 were originally employed in wire bonding and die bonding machines until it was realized that the resonant frequency of the transducer being employed to perform the actual bonding operation varied with the physical structure of the transducer, varied with the location of the transducer mount as well as the mounting torque applied to the transducer mount. The frequency further varied with the clamping force applied to the tool which was mounted in the transducer to perform the bonding operation. The frequency further varied with the bonding force applied to the bonding tool to perform the bonding operation and varied further with the type of tool and the length of tool and the rigidity of the tool being mounted in the transducer. The resonance frequency of the transducer further varied when the mechanical structure described hereinbefore was applied to the surface of a device being bonded whose surface varied with rigidity, roughness and coupling ability so as to vary further the resonant frequency of the transducer. Even when the above mentioned variables were recognized and the system was set-up in the field employing spectrum analyzers, calibrated oscilloscopes, calibrated frequency meters and probes for determining voltage and current, the prior art phase lock loop was found to vary with temperature and humidity as well as long term drift due to aging of the components.

Figure 2:
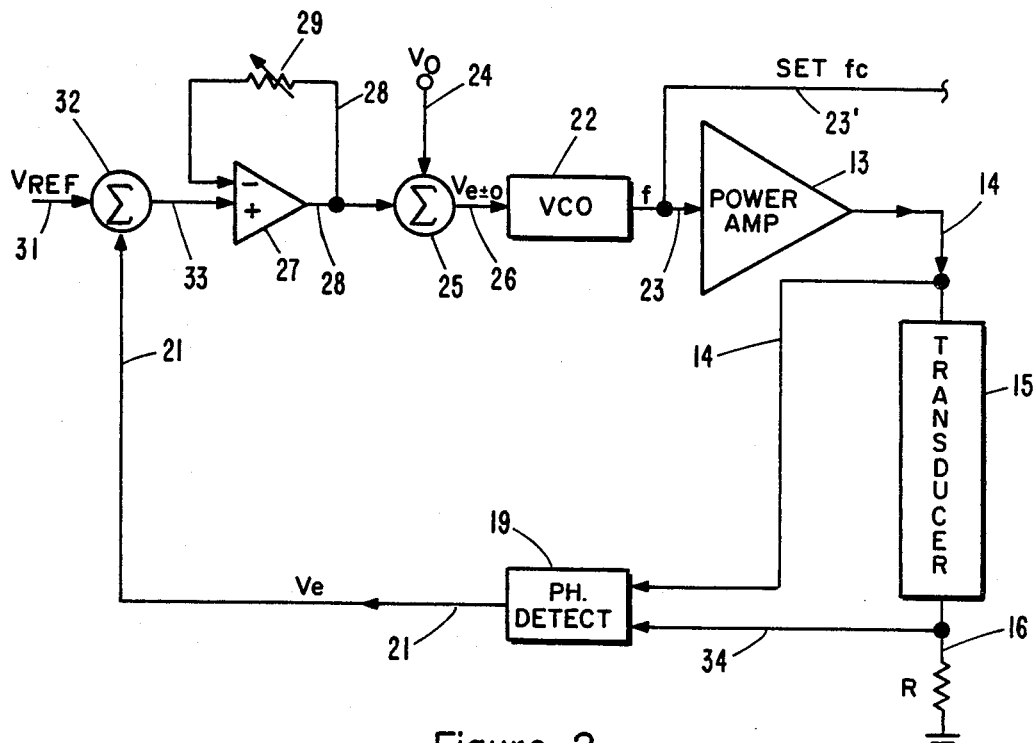
FIG. 2 is a schematic block diagram of an improved manually adjustable phase lock loop.

Refer now to FIG. 2 showing a schematic block diagram of an improved manually adjustable phase lock loop of the type employed in Kulicke and Soffa Industries Inc., Model 1482, ball bonder. This improved phase lock loop circuit provided means for setting the frequency of the voltage controlled oscillator 22 at the factory at the center of the prescribed design resonant frequency of a transducer. However, the power generating system which is set at the factory is not necessarily shipped with the transducer to be employed by the manufacturer. Unfortunately, ultrasonic transducers vary in impedance and require extremely tight quality control and manufacturing specifications to maintain a no load resonant frequency within a narrow drift range. The output of VCO 22 on line 23 is monitored at the factory on line 23' and is set with an accurate frequency meter (not shown) at the center frequency of the specification (manufacturer's specification) of the transducers of the type which will be attached to the bonding machine. However, setting the center reference frequency with a frequency meter does not assure that the transducer used by the manufacturer on the bonding machine has the same resonant frequency. In order to set the resonant frequency of the voltage controlled oscillator 22 at the resonant frequency of the transducer 15, it is necessary to apply an offset voltage on line 24 to summing circuit 25 to generate an error voltage on line 26 to adjust VCO 22 to the desired frequency. The manufacturing specification for the transducer 15 includes a center frequency plus or minus a deviation frequency. The deviation frequency may be further defined as the window which is a fractional part of the VCO window. The VCO window is set at the factory on the electronic board at an arbitrary figure which may be five times the transducer window. If the transducer window is ±300 Hertz, a figure of 2,000 Hertz may be employed for the VCO window. The amplifier 27 is provided with a feedback loop 28 having an adjustable potentiometer 29 in series therein which is fed back to the negative side of the amplifier 27. The input to the positive side of amplifier 27 is a combination of the voltage output from the phase detector 19 on line 21 and a reference voltage on line 31 which are applied to summing circuit 32 to produce a modified error voltage on line 33. The output of amplifier 27 on line 28 is applied to the summing circuit 25 which already has an offset voltage applied via line 24 to produce a modified error voltage on line 26 as an input to the VCO 22. Since the offset voltage and the window frequency are set at the factory, any changes which occur in the system which would effect the frequency of the system cause a mismatch of the set center frequency and the resonant frequency of the transducer 15 especially when the transducer is under load.

When the system shown in FIG. 2 is set up in the field, the set frequency on line 23 may be at one of the extreme edges of the window of the transducer 15 and when this frequency on line 14 is applied to the phase detector 19 and the transducer 15 is under load, the phase of the voltage signal on line 34 may generate an error voltage signal on line 21 which requires adjustment of the voltage controlled oscillator outside the window of the transducer 15. Such a condition commonly occurs with wedge bonders because the resonant frequency of the transducer 15 differs substantially between the loaded and the unloaded condition. One of two conditions usually occur when this happens. Either the phase lock loop can no longer maintain a lock on the desired frequency and/or the phase between the voltage and the current on lines 14 and 34 are substantially removed from the desired zero phase such that the power delivered by the ultrasonic power system generator is not optimum. Due to such power variations and loss of lock, the bonds produced by the bonding machine are no longer consistent in quality and often will not meet manufacturers' specifications.

Having explained the actual operation of the tuning circuit in FIG. 2, it will be recognized that service engineers could be dispatched to the manufacturer's site with an array of precision instrumentation of the type used on the factory floor to reset the tuning circuit every time a bonding tool is changed or a transducer is changed in the bonding machine or some other condition exists which would require resetting the frequency of the VCO under actual bonding conditions. It was recognized that this was not a practical solution to the problem that existed in the field.

Refer now to FIG. 3 showing a schematic block diagram of the preferred embodiment of the present invention dynamic automatic tuning system for ultrasonic generators. Automatic tuning system 40 comprises a conventional VCO 22 whose output on line 23 is applied to a conventional power amplifier 13. The output on line 14 is applied to a conventional transducer 15 and to a digital phase detector 35. The transducer active element is grounded through a precision sensing resistor 36 so as to create a voltage on line 34 which is proportional to the current in line 16. Since the precision resistor 36 is a pure resistance, the voltage on line 34 is in phase with the current flowing in line 16 and through the transducer. When the voltage on lines 14 and 34 are applied to the digital phase detector 35, the output on bus 37 is indicative of the phase difference between the voltage on line 14 and the current (voltage) on line 16. The digital output on bus 37 is applied to a digital to analog converter 38 to produce an analog error voltage on line 39 which is applied to summing circuit 41. Preferably a grounded reference voltage on line 42 is also applied to summing circuit 41. The digital phase error on bus 37 is also applied to latch 43 which operates as a buffer storage for the information on bus 37. The output from latch buffer 43 on bus 44 is applied to processor 45 which may be a dedicated microprocessor or the host processor in the bonding machine. Processor 45 is programmed to generate a series of digital outputs on bus 46 to sweep the voltage controlled oscillator 22. The digital signal on bus 46 is converted to an analog signal in digital to analog converter 47 to produce a sweep or offset voltage on line 48 which is applied to the summing circuit 41. As will be explained hereinafter, the sweep voltage is adapted to start at a frequency lower than the expected transducer resonant frequency and sweep past the expected transducer resonant frequency so as to generate the maximum current or coupling at resonance between the voltage controlled oscillator 22 and the transducer 15 which only occurs when the phase on line 14 is equal to the phase on line 34. The output of the digital phase detector 35 at resonant frequency of the transducer 15 is zero. Thus, the processor 45 is programmed to store the number corresponding to the sweep frequency on bus 46 which generates the proper offset voltage on line 48 which causes the phase of the voltage on line 14 to equal the phase of the voltage on line 34. As explained hereinbefore, the phase of the voltage on line 34 is the same as the phase of the current flowing through the transducer and also on line 16. A read/write logic control line 49 connects between processor 45 and latch 43 to time and control the read/write operations.

Having explained the operation of a preferred embodiment of the present invention, it will be understood that the digital information being presented on bus 37 is indicative of the difference in phase between the voltage and current on lines 14 and 16 and may be employed to continuously monitor for missing wires as well as to monitor bond quality as has been explained in U.S. Pat. No. 4,558,596. Further, it will be recognized that the information on bus 37 and on bus 44 may be routed to a remote production control room where the information is monitored during actual production operations and can be controlled at a central computer which is substituted for processor 45. When the processor 45 is located at a remote central location, the processor can control in any desirable way the parameters which affect the quality of a bonding machine operating on a production line located remotely from the control processor 45.

Refer now to FIG. 4 showing a waveform plot of admittance versus frequency for a typical transducer. Waveform 51 shows that the current increases initially with an increase in frequency until the resonant frequency at peak 52 is reached and the current (or admittance) again diminishes with a further increase in frequency. When the processor 45 in FIG. 3 sweeps the transducer from a low frequency to a high frequency it will reach a peak point 52 where the resonant frequency is indicated by zero phase output on bus 37. This frequency is also represented by the amount of offset voltage on line 48 which was required to create the resonant frequency condition. In the preferred embodiment system shown in FIG. 3, the processor 45 periodically is programmed to sweep the transducer frequency and determine the resonant frequency point 52 so as to determine the new offset voltage to be applied on line 48. It will be noted that this resonant frequency is so accurately determined and held by the automatic tuning system that transducers of widely different resonant frequency may be employed with the same ultrasonic power supply. Further, it will be noted that the prior art structure previously employed to determine the window of operation of the voltage controlled oscillator 22 are no longer necessary. Stated differently, the preferred embodiment automatic tuning system 40 locks onto the resonant frequency of the transducer under load conditions and modifies the frequency of the voltage controlled oscillator to accommodate the resonant frequency of the transducer under load conditions only. These load conditions also include the variables which may occur with a particular transducer such as the transducer mounting torque, the tool clamping torque, the bonding force, the surface of the device being bonded, as well as the tool type and length of the tool extended from the bonding transducer.

Refer now FIG. 5 showing another waveform plot of admittance (1/Z) versus frequency of a defective transducer. When the aforementioned frequency sweep of the transducer resonant frequency is made, it may occur that two different peaks shown as peaks 53 and 54 are found instead of a true resonant frequency. The frequency condition indicated in FIG. 5 may be a result of an improperly manufactured transducer in which the mounting flange or mount is not at a zero crossover node or some object may be touching the transducer. Such conditions have been known to occur when the bonding tool is not at a proper extension or the clamping forces on the mounting flange and the clamping of the tool in the transducer is not proper. Such conditions as shown in FIG. 5 may be easily monitored by processor 45 and the program in processor 45 is adapted to alert the operators and notify them of the actual conditions that exist.

What we claim is:

1. Apparatus for automatically tuning an ultrasonic power supply generator to the resonant frequency of a transducer comprising:
   a voltage controlled oscillator (VCO),
   a power amplifier coupled to the output of said VCO,
   a transducer coupled to the output of said power amplifier,
   a phase detector coupled to the output of the power amplifier and to a current sensor in series with said transducer power supply,
   a processor coupled to the output of said phase detector for generating offset voltages,
   a summing circuit coupled to the output of said processor and to the output of said phase detector,
   said processor being programmed to supply different offset voltages to sweep said VCO through a range of predetermined frequencies which cover the resonant frequency of said transducer and to determine the resonant frequency of said transducer and the offset voltage required to maintain said VCO at the resonant frequency of said transducer.

2. Apparatus as set forth in claim 1 wherein said phase detector is a digital phase detector and further includes a digital-to-analog converter coupled to the output of said phase detector, and the output of said digital-to-analog converter is coupled to said summing circuit.

3. Apparatus as set forth in claim 1 wherein the output of said processor is a digital output and further includes a digital-to-analog converter coupled between said processor and said summing circuit.

4. Apparatus as set forth in claim 2 which further includes a latch coupled to the output of said phase detector and the output of said latch is coupled to the input of said processor.

5. Apparatus as set forth in claim 1 which further includes a reference voltage input coupled to the input of said summing circuit.

6. Apparatus as set forth in claim 5 wherein said reference voltage is coupled to a ground connection so that the phase difference output from said phase detector is referenced to zero.

7. Apparatus as set forth in claim 1 wherein the output of said power amplifier is coupled through a supply circuit in said transducer.

8. Apparatus as set forth in claim 7 wherein said supply circuit is terminated at ground and further includes a precision sensing resistor in series in said supply circuit between ground and the output of said power amplifier.

9. Apparatus as set forth in claim 8 wherein the voltage across said precision sensing resistor is applied as a current phase input to said phase detector.

* * * * *